United States Patent
Cui et al.

(10) Patent No.: US 11,481,887 B2
(45) Date of Patent: Oct. 25, 2022

(54) APPARATUSES AND METHODS FOR WARPAGE MEASUREMENT

(71) Applicant: C&B TECH, San Diego, CA (US)

(72) Inventors: Tong Cui, San Diego, CA (US); Brandon Wallace, San Diego, CA (US)

(73) Assignee: C&B Tech, San Diego, CA (US)

( * ) Notice: Subject to any disclaimer, the term of this patent is extended or adjusted under 35 U.S.C. 154(b) by 320 days.

(21) Appl. No.: 16/641,215

(22) PCT Filed: Aug. 23, 2018

(86) PCT No.: PCT/US2018/047837
§ 371 (c)(1),
(2) Date: Feb. 21, 2020

(87) PCT Pub. No.: WO2019/040805
PCT Pub. Date: Feb. 28, 2019

(65) Prior Publication Data
US 2020/0234427 A1    Jul. 23, 2020

Related U.S. Application Data

(60) Provisional application No. 62/549,948, filed on Aug. 24, 2017.

(51) Int. Cl.
| | | |
|---|---|---|
| G01N 25/16 | (2006.01) | |
| G06T 7/00 | (2017.01) | |
| G06F 30/398 | (2020.01) | |
| G01B 11/30 | (2006.01) | |

(52) U.S. Cl.
CPC .......... *G06T 7/0004* (2013.01); *G01B 11/306* (2013.01); *G01N 25/16* (2013.01); *G06F 30/398* (2020.01); *G06T 2207/30148* (2013.01)

(58) Field of Classification Search
CPC ......... G06T 7/0004; G06T 2207/30148; G06F 30/398; G01B 11/306; G01B 11/167; G01B 11/2513; G01B 11/2504; G01B 11/162; G01N 25/16
USPC ... 356/601–624, 429, 489, 121, 237.1–237.6
See application file for complete search history.

(56) References Cited

U.S. PATENT DOCUMENTS

| | | | |
|---|---|---|---|
| 10,018,463 B1 * | 7/2018 | Hubble ................ | G01B 11/167 |
| 2005/0146708 A1 * | 7/2005 | Shi ....................... | G01R 31/311 |
| | | | 73/800 |
| 2008/0055583 A1 | 3/2008 | Lecomte et al. | |
| 2009/0060386 A1 | 3/2009 | Cooper et al. | |
| 2010/0060902 A1 * | 3/2010 | Wornson ............... | G01B 11/24 |
| | | | 356/601 |
| 2012/0204614 A1 * | 8/2012 | Isei ..................... | G01B 11/303 |
| | | | 72/12.8 |

(Continued)

*Primary Examiner* — Isiaka O Akanbi

(57) ABSTRACT

The present invention is directed to a system for measuring surface flatness, deformation and/or coefficient of thermal expansion (CTE) of a specimen comprising an image capture and analysis processing calibration means for performing image capture and analysis processing calibration of said system, a measuring means for measuring surface flatness of a specimen in a specimen holder, a heating means for heating said sample holder with a predetermined profile, and a control means for providing the predetermined heating profile onto the surface of said specimen and controlling operations of said image capture and analysis processing calibration means, said measuring means, and said heating means.

15 Claims, 5 Drawing Sheets

(56) References Cited

U.S. PATENT DOCUMENTS

2014/0354797 A1   12/2014  Woo et al.
2016/0363492 A1   12/2016  Yu et al.
2018/0266966 A1*  9/2018  Olschewski ......... G01N 21/896
2020/0098605 A1*  3/2020  Tsai ................... G01N 21/9501

* cited by examiner

FIG. 2A-B
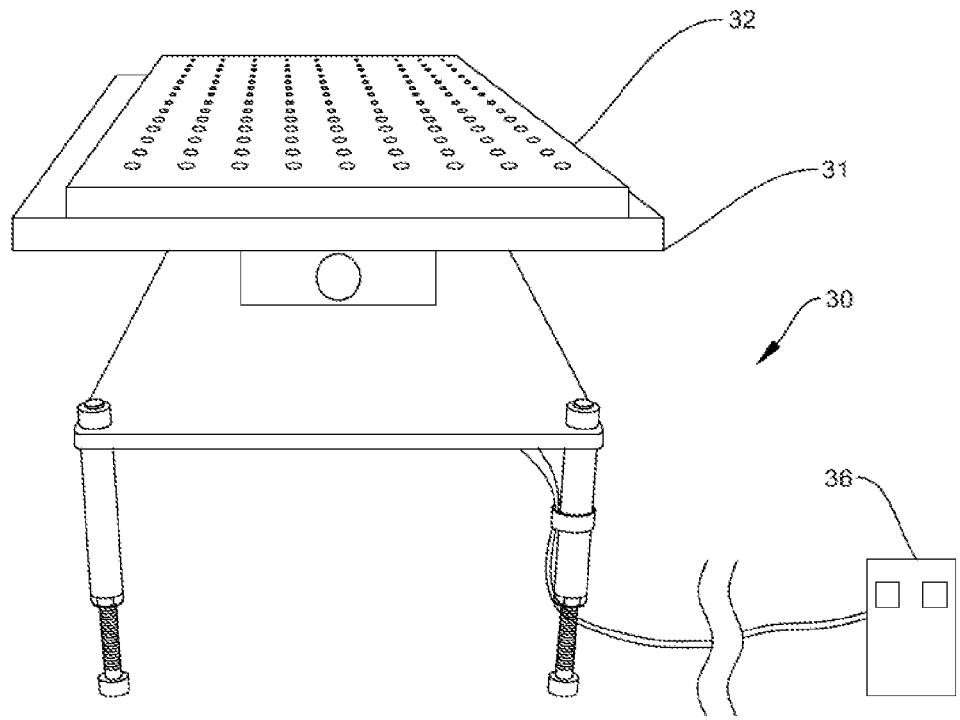
2A
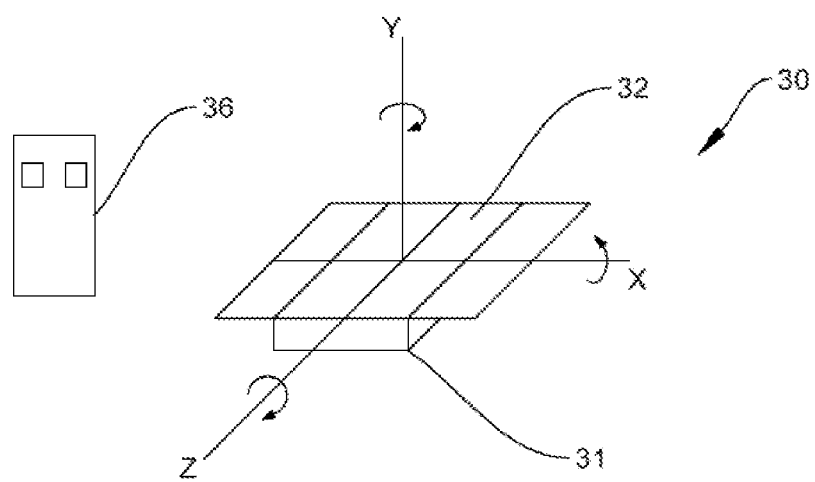
2B

FIG. 3A-B
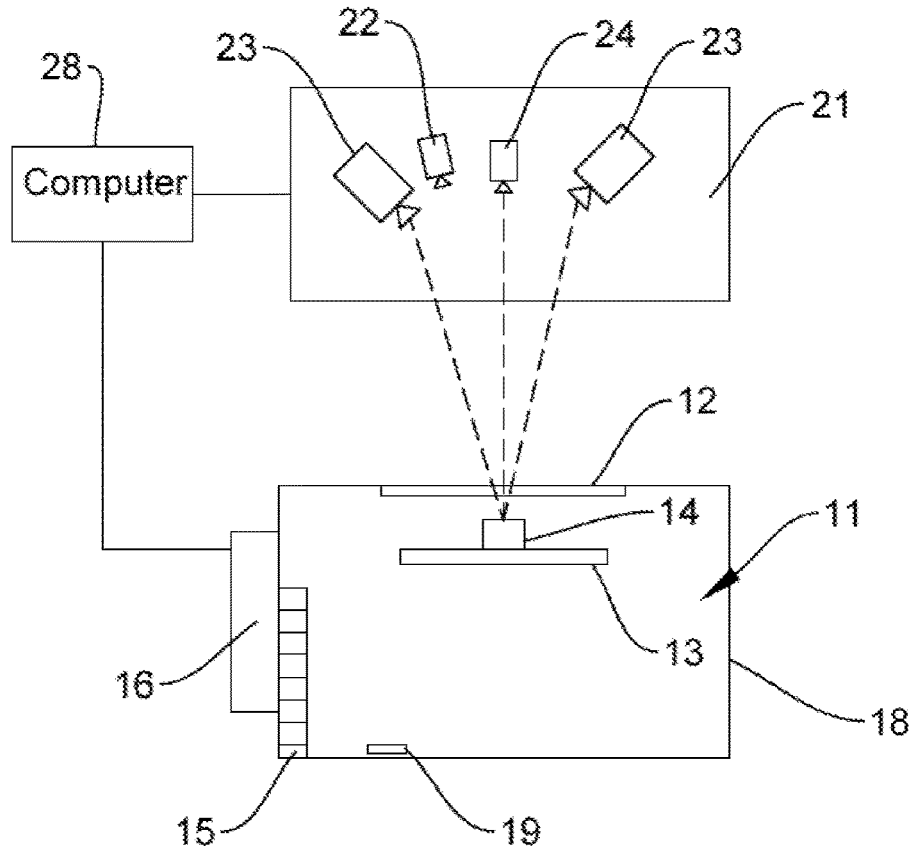
3A
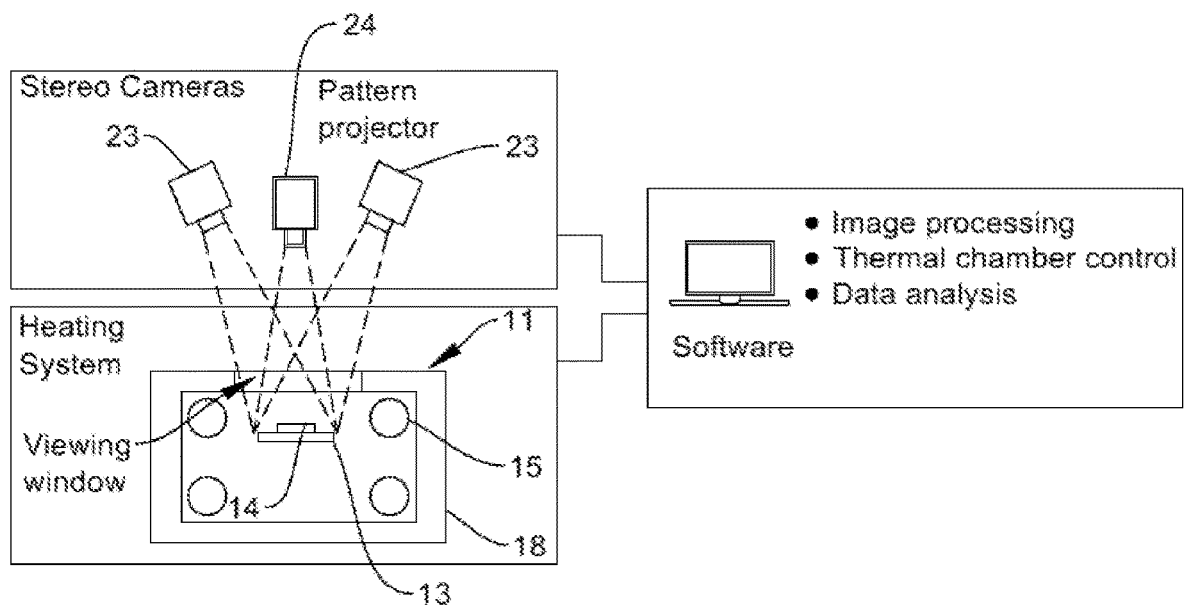
3B

FIG. 4A-C
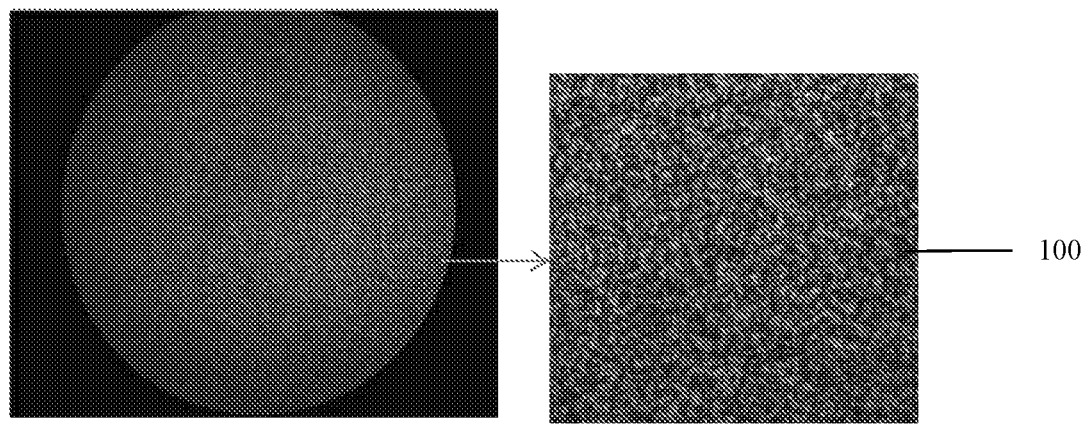
(4A)
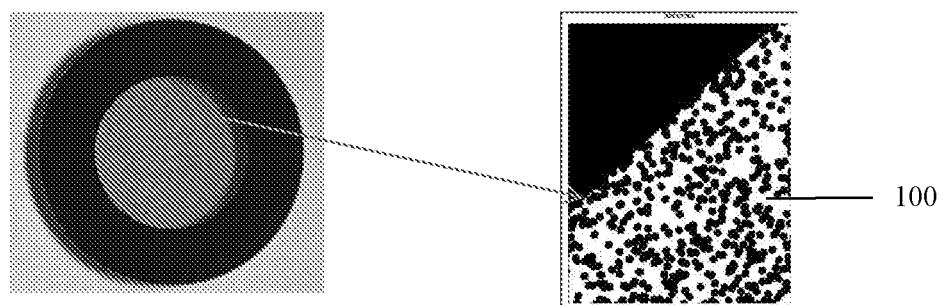
(4B)
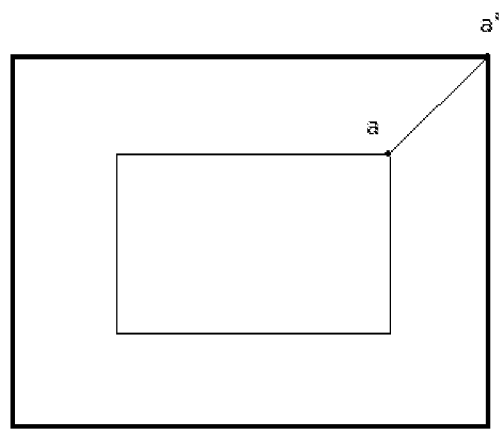
(4C)

APPARATUSES AND METHODS FOR WARPAGE MEASUREMENT

BACKGROUND OF THE INVENTION

Non-flatness, or warpage, is a frequent problem in IC chip manufacturing, due to the design problems, material defects, and/or in proper processing thereof. The ability to distinguish and reject components whose warpage exceeds the desired specifications is important on design qualification and the production line because it allows the manufacturer to spot the problems in the manufacturing steps and maintain product quality.

An image capture and analysis processing utilizing a pair of cameras can be used as a non-contacting optical method to track and register images for accurate 2D and 3D measurement, especially for deformation and strain measurement of solids, such as advanced integrated circuit (IC) chips. As these chips have become thinner, IC chip warpage has increased as a problem. This is exacerbated using materials with dissimilar coefficients of thermal expansion (CTE) in the many layers of current chip technology.

SUMMARY OF THE INVENTION

In one aspect provides a system for measuring surface flatness, deformation and/or coefficient of thermal expansion (CTE) of a specimen comprising an image capture and analysis processing calibration means for performing image capture and analysis processing calibration of said system, a measuring means for measuring surface deformation and/or coefficient of thermal expansion (CTE) of a specimen in a specimen holder, a temperature changing means for heating or cooling said sample holder with a predetermined profile, and a control means for providing the predetermined heating or cooling profile onto the surface of said specimen, and controlling operations of said image capture and analysis processing calibration means, said measuring means, and said temperature changing means.

In another aspect provides a method for measuring surface flatness, deformation and/or coefficient of thermal expansion (CTE) of a specimen comprising (1) performing an image capture and analysis processing calibration via a calibration assembly, (2) replacing calibration assembly with a test specimen, (3) projecting light from a light source module to said test specimen with a designed pattern, or to said test specimen printed with a designed pattern, or to said test specimen with a selected surface feature, (4) taking images of the test specimen by a measuring means at room temperature $T_1$, (5) heating up or cooling down the specimen via a temperature changing means to T, (6) taking images of the test specimen by said measuring means at temperature T, (7) processing the images using an image capture and analysis processing means to determine strain arising from $(T-T_1)$, (8) generating strain c versus temperature plot, and (9) determining surface flatness of a specimen based on the results of Step 8.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 2A/B illustrate an exemplary calibration assembly (2A) and the mechanism of operating the calibration assembly (2B).

FIG. 3A/B provide an exemplary device in accordance with the embodiments FIG. 3A, the apparatus comprises a temperature changing module such as a heating chamber 11, an image capture and analysis processing module 21 and a computer 28. FIG. 3B provides a simplified system based on FIG. 3A.

FIG. 4A-4C illustrate exemplary surface correlation embodiments (such as a designed pattern or a selected feature of a specimen) to apply the image capture and analysis processing method via the exemplary device. FIG. 4A provides a representative image 100 of a designed pattern projects onto or is printed on the surface of a specimen. FIG. 4B shows an exemplary etched glass with a designed pattern (an example of a designed pattern projection means) used to fit with a light source to project designed pattern onto the surface of the specimen. FIG. 4C shows an exemplary surface feature of the specimen selected (from a to a') for image capture and analysis processing measurement.

DETAILED DESCRIPTION OF THE INVENTION

Global semiconductor packaging and testing market value reached 24.5 billion US dollars in 2014, among which, testing related to warpage is an integral part. The IC chip industry can be divided into chip design, manufacturing and packaging and testing. Warpage measurement analysis figures heavily in each one of these, especially IC packaging and testing such as flip chip BGA board assembly especially with increasing chip size and the use of lead free solders. For example, lead free solders, such as SAC305 are less compliant and have higher reflow temperatures at 260° C. than the older leaded solders, below 230° C. JEDEC specifies that warpage on FCBGA packages must be less than a certain value to assure package reliability. To help this, various material approaches have been developed. The gap between chip and substrate is filled with epoxy underfill to help mitigate the stress induced by the solder bump interconnect. While underfill can protect the solder bumps, it also exacerbates the bending deformation of the IC chip since the coefficients of expansion (CTE) of underfill is very high and this higher degree of coupling through underfill introduces more warpage. Warpage is thus one of the critical specifications in chip design that determines if the design passes or fails the qualification. Companies often have to spend millions of dollars to redesign IC chips just to meet warpage specification.

However, at temperatures above its glass transition, the material becomes soft. Conventional methods used to measure the CTE such as the strain gauge, dilatometer and thermomechanical analysis (TMA) are contact-based methodologies that have difficulties in testing soft materials. Current CTE measurement instrument is designed to compress a test sample with a probe by applying a preload. Even a small preload will make a soft material deform significantly, and introduce enormous measurement errors. It has been a great challenge to measurement polymeric material CTE above their glass transition temperature.

As such, warpage and CTE measurement above glass transition temperature (Tg) are poorly measured with current instruments, due to the measurement approach. The current warpage measurement devices are suffering from lower resolution, low efficiency and high cost, where CTE measurement devices cannot provide reliable measurement for material at soft state above their glass transition temperatures. Thermal analyzers or dilatometers are contact measurement methods and usually used for coefficient of thermal expansion (CTE) measurement of hard solid materials or liquids. CTE is key material property that defines material expansion and contraction at different temperatures, which is directly related to chip reliability.

Figure 1:
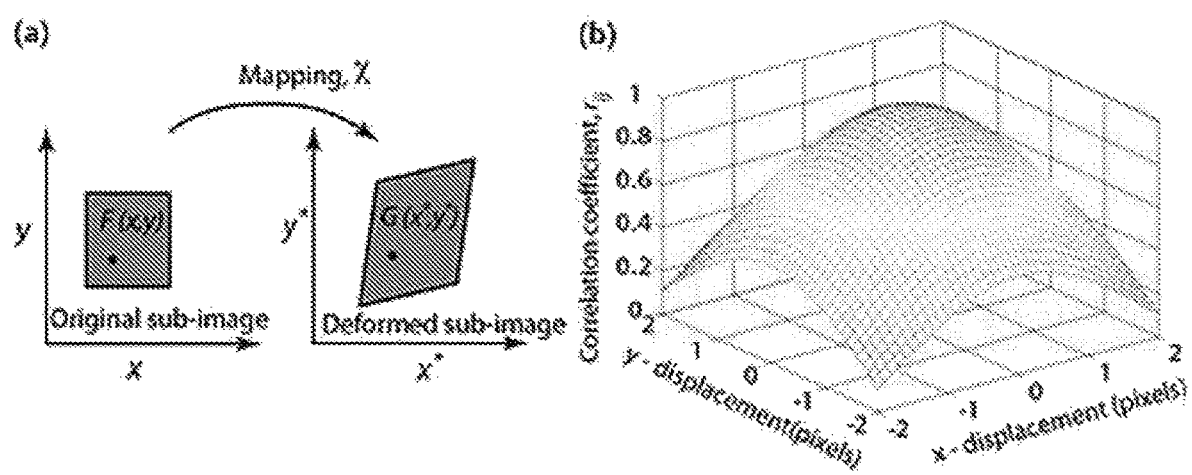
FIG. 1 illustrates the general working mechanism. By comparing the selected location before and after object deformation (see FIG. 1A), the topography and deformation can be calculated as shown in FIG. 1B.

An image capture and analysis processing (correlation) involving the use of stereo cameras is a computer vison based, non-contact optical technique for measuring surface flatness and displacement of a specimen. Its principle is to use triangulation methods to reconstruct the spatial coordinate with parameters via a camera system obtained from calibration procedures. It can be also used to track movement while an object is deforming, such as to track a designed pattern movement or a fixed-point movement. FIG. 1 illustrates the general working mechanism. By comparing the selected location before and after object deformation (see FIG. 1A), the topography and deformation can be calculated as shown in FIG. 1B. In some embodiments, for an image capture and analysis processing to work effectively, it requires utilizing the pattern unique with clear contract to its background. In some embodiments, for image capture and analysis processing to work effectively, it requires comparing a selected fixed feature of a test spaceman before and after object deformation.

The present invention adapts an approach for accurate warpage, displacement and CTE measurement of a specimen in a controlled environment (e.g., IC chip warpage measurement). For example, in one embodiment, the present invention adopts an image capture and analysis processing module in combination with a controlled temperature changing module (e.g., a heating or cooling chamber) for measuring CTE of samples. The strains on the test sample/specimen arising from the heating or cooling can be obtained directly for the CTE determination. The strains of the test specimen in (x, y, z) three directions are determined by an image capture and analysis processing module and therefore can be used for CTE determination in x, y and z three directions independently. These are necessary for composites or anisotropic materials. The test specimen can be in any shape and dimension, which can be placed inside the heating or cooling chamber without any fixing device, eliminating the need to accurately know the length of the test specimen as in traditional contact CTE measurement apparatus.

In some embodiments, the image capture and analysis processing module comprises one or more pair of digital cameras (e.g., one pair, two pairs, three pairs, or four pairs or more digital cameras), one or more light source modules to project light on the specimen and a temperature measuring means to measure the surface temperature of the specimen. In certain embodiments, the light source module projects visible or invisible light. In certain embodiments, the light source module projects a selected wavelength of light, such as green light (510 nm) and blue light (470 nm). In certain embodiments, the light sources are further fitted with a designed pattern projection means to project said pattern on the specimen. In certain embodiments, a designed pattern is printed on the specimen. In certain embodiments, a feature of the specimen is selected to incorporate to image capture and analysis processing measurement.

In some embodiments, the light source module comprises a spontaneous emission light source, an amplified spontaneous emission light source, a superluminescent diode, a light emitting diode (LED), a broadband supercontinuum light source, a mode-locked laser, a tunable laser, a Fourier-domain mode-locked light source, an optical parametric oscillator (OPO), a halogen lamp, or a doped crystal fiber. In certain embodiments, the light source module comprises a designed laser light source with its corresponding diffractive optical element to project a designed pattern.

In some embodiments, the light source module is a laser projection system applying to large projection area. A skilled person in the art would readily recognize the proper light source module in view of the size of the projection area, the surface features of specimen and/or other conditions for proper selection of light sources.

In certain embodiments, a designed pattern projection means is a diffractive optical element used to generate complex light patterns with precisely defined dimensions in a specified plane. The use of a diffractive optical element can be applied to specimen with black surface and/or where the printed method is not applicable.

In order to obtain accurate measurements, a calibration process is needed to calibrate the stereo cameras. Only after calibration, the true three-dimensional positions can be identified via a stereo vision system.

In some embodiments, a standard grid is used to calibrate the image capture and analysis processing means. This can be used to obtain the parameters of the real relative location of the stereo cameras in the an image capture and analysis processing means, and these parameters will remain the same when measuring the samples. With the standard grid in the thermal chamber, the image capture and analysis processing means can be calibrated and the relative location of the two cameras can be obtained by refraction.

FIG. 2A provides an exemplary calibration assembly, where a calibration target 32 with grids engraved on the surface is on top of a platform 31 supported and operated by a mechanical means and is controlled by a computer via a keypad 36. FIG. 2B illustrates an operation scheme of said calibration assembly 30. The calibration assembly comprises a platform 31, a calibration target 32 used in the calibration and a keypad 36. In some embodiments, the calibration target 32 is a flat plate with grids or circles engraved or printed on its surface with fixed distance between the grids or dots. In some embodiments, the calibration assembly 30 is remotely controlled to rotate along the x, y, or z axis and translate the calibration target 32 in x, y or z directions by the keypad 36 before the actual measurement of a sample. It is unexpected found that such calibration is needed inside the temperature changing module before the image capture and analysis processing measurement to ensure the accuracy of the results. To achieve high accuracy, rotation of the calibration target in many degrees of freedom is performed. In some embodiments, the rotation is at least 20 rotations in relation with the grids or dots of the target 32. Such calibration assembly can provide fast speed, high accuracy, repeatedly before the measurement of a specimen in an enclosed environment of a temperature changing module.

The present invention comprises a method for measuring CTE of a test specimen, device or element. The method preferably involves a heating chamber for housing and heating the specimen, a set or more digital cameras (e.g., two digital cameras), a thermal imaging camera, an illumination source, and a computer. The method includes the steps of calibrating the image capture and analysis processing module, modifying the surface of the specimen to have designed pattern or utilizing the existing patterns/features on the sample surface, placing the specimen inside the heating chamber, using a projection light source (e.g., an illumination light source) to project certain light (e.g., to illuminate) the specimen surface from outside of the temperature changing means (e.g., a heating chamber), using a set or more stereo cameras (e.g., two, or four digital cameras) to capture the images of the specimen surface at room temperature $T_1$, heating up or cooling down the specimen to a pre-specified temperature $T_2$, taking images of the specimen surface again, evaluating the captured images at $T_1$ and $T_2$ to determine the strains on the surface of the test specimen using 3D-VIC. CTE is determined using:

$$CTE = \frac{\varepsilon}{\Delta T}$$

where $\varepsilon$ is the strain in a deformable solid arising from the temperature difference $\Delta T = T_2 - T_1$. The method also includes taking multiple images at multiple temperatures to form the curve of strain versus temperature. CTE at different temperature is determined from the slope of the curve at the particular temperature. An average CTE over a span of temperature can also be determined from the curve. A computer is used for controlling the apparatus and the measurement computation.

In some embodiments, the system or apparatus comprises an image capture and analysis processing module, a temperature changing module (such as an infrared heating device, or a convection heating device, or a combination thereof), and a system control means (such as a computer).

In some embodiments, the temperature changing module provides 1) the required temperature profiles of the test samples; 2) a uniform temperature distribution in the sample loading area; and 3) a pre-determined demanding temperature ramping rate. In certain embodiments, the temperature changing module utilizes infrared radiation or convection to raise the specimen temperature.

In some embodiments, the image capture and analysis processing module comprises at least one pair of cameras (i.e., stereo cameras). In certain embodiments, one pair of cameras are used to acquire small field of view to maintain high resolution, and another pair of cameras to see bigger field of view. In certain embodiments, a filter is used to each camera to filter out certain wave length of light in such to increase the contract of the images captured by camera's image sensor.

In some embodiments, the image capture and analysis processing module comprises selected light sources, for example a blue light (455 nm wave length), or near infrared light (invisible light) to project light onto the surface of a sample. By projecting specific wave length of light (e.g., a blue light), the sample does not need to be painted (in other words, contaminated or destructed), cameras with filters can still see the pattern with good contract, and thus measurement can be done nondestructively. In certain embodiments, the light source is fitted with a designed pattern projection means to project said designed pattern on the specimen. In certain embodiments, the designed pattern projection means is an etched glass, plastic, or any suitable materials with a designed pattern.

In some instances, a temperature changing module uses infrared quartz heating elements to radiate massive energy in a time frame of few seconds. In some instances, a temperature changing module uses convection (e.g., hot air) to raise temperature in a time frame of few seconds. Testing samples can be heated up with a rapid ramp rate up to 5 C/s. In some embodiments, the temperature changing module uses infrared heat, convection, or a combination thereof. The temperature controller in the heating system controls the sample temperature according to the pre-determined and required temperature profile. The temperature changing module has a uniform temperature distribution in sample loading area, so that each sample in a batch has the same temperature at each set point. This is accomplished by placing the infrared heater (or a convection heater, or a combination thereof) in a pattern that optimizes heat distribution. Radiation is the dominant heat transfer, but convection also plays an important role, especially for the top heating.

In an infrared heater, the radiation energy each sample receives is inversely proportional to its distance to the heater. Since samples are tested in a batch mode, each sample will not receive the same amount radiation energy and therefore rise to different temperature levels, depending on their locations. In some embodiments, parabolic reflectors are used to project the radiation energy into several focused areas. In this way, each sample in a batch is expected to have similar temperature at a certain time point. At the same time, samples will be heated both from top and bottom, and this will ensure the temperature uniformity within a single sample, since the conductivity of IC chip materials are low and it takes tens of seconds to conduct heat from one side to the other.

A system control means controls the whole system and measurement process, including camera calibration, image capture at different temperatures, and automated data processing. For example, a computer, or the like, connects to cameras, a temperature changing module and an image capture and analysis processing module to realize the automated test procedures, including camera calibration, temperature ramp up and cool down, image capture, image processing and result generation.

In some embodiments, the control means such as a computer will send a signal to an image capture and analysis processing module to capture an image pairs correspondingly during calibration stage. All the 20 pairs, or more of images will be used to calibrate the camera system. It is found that it is critical to perform the calibration step. Otherwise, the system will not achieve high accuracy of the measurement. Unlike any known calibration assembly, the invention assembly provides high accuracy, and fast operation in a practical fashion.

In some embodiments provide a system for measuring surface flatness, deformation and/or coefficient of thermal expansion (CTE) of a specimen comprising an image capture and analysis processing calibration means for performing image capture and analysis processing calibration of said system, a measuring means for measuring surface deformation and/or coefficient of thermal expansion (CTE) of a specimen in a specimen holder, a temperature changing means for heating or cooling said sample holder with a predetermined profile, and a control means for providing the predetermined heating or cooling profile onto the surface of said specimen, and controlling operations of said image capture and analysis processing calibration means, said measuring means, and said temperature changing means. In certain embodiments, said image capture and analysis processing calibration means comprises a platform, and a calibration target for image capture and analysis processing calibration configured to rotate along the x, y, or z axis of the platform. In certain embodiments, said calibration target is a flat plate with grids or circles engraved or printed on its surface with fixed distance between the grids or dots. In certain embodiments, said image capture and analysis processing calibration means is placed in a temperature changing means. In some embodiments, the measuring means comprise an image capture and analysis processing module to captures images of the specimen surface at room temperature $T_1$ and at a pre-specified temperature $T_2$ to determine the surface flatness, deformation and/or coefficient of thermal expansion (CTE) on the surface of the test specimen. In certain embodiments, the image capture and analysis processing module comprises one or more pair of digital cameras, one or more light sources to project light on the specimen and a temperature measuring means to measure the surface temperature of the specimen. In certain embodiments, said one or more light sources are fitted with a designed pattern projection means to project said designed pattern on the specimen. In certain embodiments, said designed pattern projection means is an etched glass with designed pattern. In certain embodiments, said light sources project light to the surface of the specimen printed with a designed pattern. In certain embodiments, said light sources project light to a selected surface feature of the specimen. In certain embodiments, the temperature measuring means is a thermal imaging camera.

In some embodiments, the temperature changing means comprises a temperature changing module with a temperature controller to control the specimen temperature according to the pre-determined and required temperature profile. In certain embodiments, the temperature changing module utilizes infrared radiation or convection to raise the specimen temperature. In certain embodiments, said temperature changing module comprises an outside box, heating elements, a temperature controller, one or more thermocouples, a specimen holder inside the temperature changing module and a transparent window on top of the temperature changing module made of soda-lime glass, or quartz glass, or the like.

In some embodiments, said control means is a computer.

In some embodiments provide a method for measuring surface flatness, deformation and/or coefficient of thermal expansion (CTE) of a specimen comprising (1) performing an image capture and analysis processing calibration via a calibration assembly, (2) replacing calibration assembly with a test specimen, (3) projecting light from a light source module to said test specimen with a designed pattern, or to said test specimen printed with a designed pattern, or to said test specimen with a selected surface feature, (4) taking images of the test specimen by a measuring means at room temperature $T_1$, (5) heating up or cooling down the specimen via a temperature changing means to T, (6) taking images of the test specimen by said measuring means at temperature T, (7) processing the images using an image capture and analysis processing means to determine strain arising from $(T-T_1)$, (8) generating strain c versus temperature plot, and (9) determining surface flatness of a specimen based on the results of Step 8.

Exemplary Designs

FIG. 3A-3B. As an illustration purpose in provides an exemplary device in accordance with the embodiments FIG. 3A, the apparatus comprises a temperature changing module such as a heating chamber 11, an image capture and analysis processing module 21 and a computer 28. FIG. 3B provides a simplified system based on FIG. 3A.

The heating chamber (module) 11 is composed of an outside box 18, heating elements 15, temperature controller 16, one or more thermocouples 19, a specimen holder 13 to hold specimen 14 inside the heating chamber 11. A transparent window 12 on top of the heating chamber 11 made of soda-lime glass, or quartz glass, or the like, is generally adopted although it can be on other side of the heating chamber 11 as well.

An image capture and analysis processing module 21 is generally placed above the heating chamber 11. The image capture and analysis processing module comprises a pair of digital cameras 23 (i.e., the stereo cameras) and a light source 22 fitted with an etched glass with a designed pattern (an example of pattern projector as shown in FIG. 3B). In some embodiments, a designed pattern printed on the surface, or a selected surface feature of the specimen is used coupled with a light source module without fitted an etched glass. The cameras 23 are separated by a distance and focus on the specimen 14 inside and through the window 12 of the heating chamber 11. In addition, a thermal imaging camera 24 is also focused on the specimen surface for instantaneous temperature measurement.

The cameras 23, thermal imaging cameras 24 and the heating chamber 11 are connected and controlled by a computer 28. Before applying the invention methods, first a calibration is employed as described herein.

Then, certain surface correlation feature (such as a designed pattern or a selected fixed dot) is required to apply the image capture and analysis processing method via the exemplary device. FIG. 4A provides a representative image 100 of a designed pattern projects onto or is printed on the surface of a specimen. FIG. 4B shows an exemplary etched glass with a designed pattern (an example of a designed pattern projection means) used to fit with a light source to project designed pattern onto the surface of the specimen. In other embodiments, the image of designed dots or speckles on the surface of the test specimen can be printed or generated by spray paint, air brush, perforated sheets with spray paints, or toothbrush, and a plurality of methods of alike. FIG. 4C shows an exemplary surface feature of the specimen selected (from a to a') for image capture and analysis processing measurement.

Figure 5:
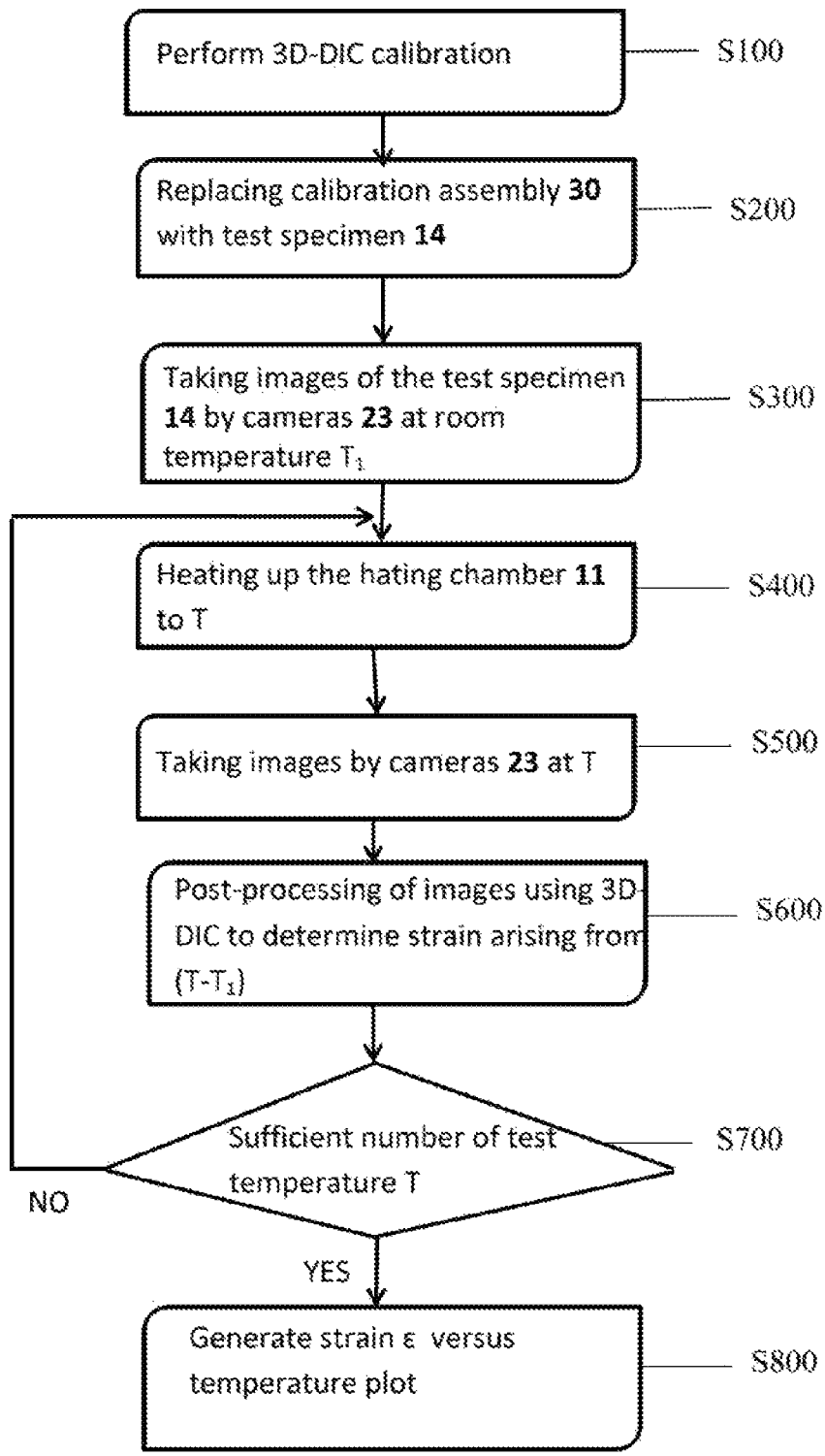
FIG. 5 provides an exemplary flowchart for the procedure employing an invention system for the CTE measurement of a specimen.

FIG. 5 is a block diagram showing an exemplary flowchart for describing the CTE measurement method using the exemplary apparatus shown in FIG. 4.

First, at step S100, to perform the CTE measurement, a calibration of the image capture and analysis processing module 21 is performed. The calibration assembly 30 is placed inside the heating chamber 11 on the specimen holder 13. With the light from light source 22 shining on the surface of the calibration target 32 through the window 12, the two digital cameras 23 focus on and take images of the calibration target 32. The calibration assembly 31 moves the calibration target 32 by a rotation and/or translation controlled and specified by the remote keypad 36. Images of the surface of the calibration target at several orientations and locations on the specimen holder 13 are taken by the two digital cameras 23. These images are then used to complete the calibration of the image capture and analysis processing module 21 through correlation analysis by the computer 28.

At step S200, a specimen 14 of the material to be tested having a designed dots pattern 100 (from a projection via a light source or is printed specifically) is placed on top of the specimen holder 13 to replace the calibration assembly 31, and 32.

At step S300, digital images of the specimen surface are taken by cameras 23 through the window 12 of the heating chamber 11 at room temperature $T_1$.

At step S400, the heating element 15 is activated to heat up the chamber 11 to a pre-specified temperature $T=T_2$. The temperature T is read by the thermocouples 19 and/or the thermal imaging camera 24.

At step S500, digital images of the specimen surface at temperature T are taken by cameras 23.

At step S600, the images taken from the two cameras 23 in step S300 and step S500 are used in computer 28 to perform image capture and analysis processing calculation to determine the surface flatness at each temperature and the three-dimensional strains $\varepsilon$ of the specimen 14 arising from thermal expansion from temperature $T_1$ to T. CTE is then determined by $CTE=\varepsilon/\Delta T$, where $\Delta T=T-T_1$ and $\varepsilon$ is the strain at T.

At step S700, one judges the number of temperature tested for the measurement of CTE. If NO, the process goes back to step S400 and repeat the steps S400, S500 and S600 for a new temperature $T=T_3$ typically higher than $T_2$. If YES, the operation goes to the next step S800.

At step S800, computer 28 generates warpage and/or strain $\varepsilon$ versus temperature T curve for temperatures tested. The slope at a temperature $T_a$ on the strain $\varepsilon$ versus temperature T curve is the CTE at the particular temperature $T_a$. An average CTE over a span of temperature can also be determined from the curve. The strain value from different directions of the specimen surface determined from the image capture and analysis processing can also be used in creating the curve to measure the CTE in different directions for anisotropic materials.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A system for measuring surface flatness, deformation and/or coefficient of thermal expansion (CTE) of a specimen comprising an image capture and analysis processing calibration means for performing image capture and analysis processing calibration of said system, wherein said image capture and analysis processing calibration means comprises a platform configured to rotate along the x,y, and z axis of the platform, and a calibration target for image capture and analysis processing calibration, a measuring means for measuring surface deformation and/or coefficient of thermal expansion (CTE) of a specimen in a specimen holder, a temperature changing means for heating or cooling said sample holder with a predetermined profile, and a control means for providing the predetermined heating or cooling profile onto the surface of said specimen, and controlling operations of said image capture and analysis processing calibration means, said measuring means, and said temperature changing means, wherein the measuring means comprise an image capture and analysis processing module comprising one or more pair of digital stereo cameras, one or more light sources to project light on the specimen and a temperature measuring means to measure the surface temperature of the specimen to captures images of the specimen surface at room temperature $T_1$ and at a pre-specified temperature $T_2$ to determine the surface flatness, deformation and/or coefficient of thermal expansion (CTE) on the surface of the test specimen.

2. The system of claim 1, wherein said calibration target is a flat plate with grids or circles engraved or printed on its surface with fixed distance between the grids or dots.

3. The system of claim 1, wherein said image capture and analysis processing calibration means is placed in a temperature changing means.

4. The system of claim 1, wherein said one or more light sources are fitted with a designed pattern projection means to project said designed pattern on the specimen.

5. The system of claim 4, wherein said designed pattern projection means is an etched glass with designed pattern.

6. The system of claim 1, wherein said light sources project light to the surface of the specimen printed with a designed pattern, or to a selected surface feature of the specimen.

7. The system of claim 1, wherein the temperature measuring means is a thermal imaging camera.

8. The system of claim 1, wherein the temperature changing means comprises a temperature changing module with a temperature controller to control the specimen temperature according to the pre-determined and required temperature profile.

9. The system of claim 8, wherein the temperature changing module utilizes infrared radiation or convection to raise the specimen temperature.

10. The system of claim 8, wherein said temperature changing module comprises an outside box, heating elements, a temperature controller, one or more thermocouples, a specimen holder inside the temperature changing module and a transparent window on top of the temperature changing module made of soda-lime glass, or quartz glass.

11. The system of claim 1, wherein said control means is a computer.

12. A method for measuring surface flatness, deformation and/or coefficient of thermal expansion (CTE) of a specimen comprising (1) performing an image capture and analysis processing calibration via a calibration assembly comprising a platform configured to rotate along the x,y, and z axis of the platform, and a calibration target for image capture and analysis processing calibration, (2) replacing calibration assembly with a test specimen, (3) projecting light from a light source module to said test specimen with a designed pattern, or to said test specimen printed with a designed pattern, or to said test specimen with a selected surface feature, and taking images of the test specimen by a measuring means comprising an image capture and analysis processing module comprising one or more pair of digital stereo cameras, one or more light sources fitted with a designed pattern projection means to project said designed pattern on the specimen and a temperature measuring means to measure the surface temperature of the specimen to captures images of the specimen surface at room temperature $T_1$, (4) heating up or cooling down the specimen via a temperature changing means to T, and repeating step (3) to take images of the test specimen by said measuring means at temperature T, (5) processing the images using an image capture and analysis processing means to determine strain arising from (T−T$_1$), and determining surface flatness of a specimen based on the results of Step 5 while generating strain ε versus temperature plot.

13. The method of claim 12, wherein said calibration target is a flat plate with grids or circles engraved or printed on its surface with fixed distance between the grids or dots.

14. The method of claim 12, wherein the temperature changing means comprises a temperature changing module with a temperature controller to control the specimen temperature according to the pre-determined and required temperature profile.

15. The method of claim 14, wherein the temperature changing module utilizes infrared radiation or convection to raise the specimen temperature.

* * * * *